(12) United States Patent
Kang et al.

(10) Patent No.: US 7,573,070 B2
(45) Date of Patent: Aug. 11, 2009

(54) ORGANIC LIGHT EMITTING DISPLAY AND METHOD OF FABRICATING THE SAME

(75) Inventors: Tae-Wook Kang, Seongnam-si (KR);
Mu-Hyun Kim, Suwon-si (KR);
Myung-Won Song, Suwon-si (KR);
Sang-Woong Lee, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/017,648

(22) Filed: Dec. 22, 2004

(65) Prior Publication Data

US 2006/0060838 A1 Mar. 23, 2006

(30) Foreign Application Priority Data

Sep. 23, 2004 (KR) .................. 10-2004-0076667

(51) Int. Cl.
*H01J 1/66* (2006.01)
*H01J 1/72* (2006.01)
*H01L 31/12* (2006.01)

(52) U.S. Cl. ............. 257/79; 257/103; 257/E51.018; 313/504

(58) Field of Classification Search .......... 257/40, 257/79, 103, E51.018–E51.022; 313/503–504; 438/22, 82, 99
See application file for complete search history.

(56) References Cited

U.S. PATENT DOCUMENTS 6,506,616 B1 1/2003 Kim et al.
7,109,650 B2 * 9/2006 Park et al. ............... 313/504

2002/0047567 A1 4/2002 Fujita et al.

(Continued)

FOREIGN PATENT DOCUMENTS

CN 1496667 5/2004

(Continued)

OTHER PUBLICATIONS

Dr. J. Y. Lee, et al.; Laser-Induced Thermal Imaging of Polymer Light-Emitting Materials on Poly (3,4-ethylenedioxythiophene): Silane Hole-Transport Layer, Advanced Matter 2004, 16, No. 1, Jan. 5; pp. 51-54.

(Continued)

*Primary Examiner*—Douglas M Menz
*Assistant Examiner*—Matthew W Such
(74) *Attorney, Agent, or Firm*—H.C. Park & Associates, PLC

(57) ABSTRACT

An organic light emitting display and method of fabricating the same are provided. The organic light emitting display and the method of fabricating the same in accordance with the present invention is capable of preventing an organic layer pattern from being cut due to a step between a first electrode and an inorganic pixel defining layer by forming an inorganic pixel defining layer having an opening for exposing at least a portion of the first electrode to a small thickness using a deposition method. In addition, since the first electrode and the organic layer pattern are closely adhered during a transfer process to enable the transfer process using a laser beam having low energy, thereby improving transfer efficiency, improving luminous efficiency of the OLED, and increasing lifetime of the OLED.

6 Claims, 2 Drawing Sheets

U.S. PATENT DOCUMENTS

| | | | |
|---|---|---|---|
| 2003/0094615 A1* | 5/2003 | Yamazaki et al. | 257/72 |
| 2003/0094894 A1 | 5/2003 | Andry et al. | |
| 2003/0127651 A1* | 7/2003 | Murakami et al. | 257/72 |
| 2003/0127657 A1* | 7/2003 | Park | 257/79 |
| 2003/0169242 A1* | 9/2003 | Nakanishi | 345/204 |
| 2004/0113150 A1* | 6/2004 | Sakakura et al. | 257/66 |
| 2004/0119419 A1* | 6/2004 | Kai et al. | 315/169.3 |
| 2005/0023969 A1* | 2/2005 | Omata et al. | 313/504 |
| 2005/0057151 A1* | 3/2005 | Kuwabara | 313/506 |
| 2005/0082534 A1* | 4/2005 | Kim et al. | 257/72 |
| 2005/0093784 A1* | 5/2005 | Sakurai | 345/76 |

FOREIGN PATENT DOCUMENTS

| | | |
|---|---|---|
| EP | 1315209 | 5/2003 |
| EP | 1385209 | 1/2004 |
| JP | 2001290441 | 10/2001 |
| JP | 2002287666 | 10/2002 |
| JP | 2003168569 | 6/2003 |
| JP | 2003217855 | 7/2003 |
| JP | 2003288983 | 10/2003 |
| JP | 2003288986 | 10/2003 |
| JP | 2004004757 | 1/2004 |
| JP | 2004192935 | 7/2004 |
| KR | 10-2003-0035968 | 5/2003 |
| KR | 1020030068452 | 8/2003 |

OTHER PUBLICATIONS

Chinese Office Action dated Feb. 1, 2008.

* cited by examiner

ORGANIC LIGHT EMITTING DISPLAY AND METHOD OF FABRICATING THE SAME

CROSS-REFERENCE TO RELATED APPLICATION

This application claims priority to and the benefit of Korean Patent Application No. 2004-0076667, filed Sep. 23, 2004, the disclosure of which is incorporated herein by reference in its entirety.

BACKGROUND OF THE INVENTION

1. Field of the Invention

The present invention relates to an organic light emitting display and method of fabricating the same and, more particularly, to an organic light emitting display including an inorganic pixel defining layer formed using a deposition method and method of fabricating the same.

2. Description of the Related Art

An organic light emitting display (OLED) among flat panel displays is an emissive display of electrically exciting organic compound to emit light so that it does not require a backlight unit, unlike LCD. Therefore, the OLED may be fabricated in a lightweight and thin type and by simple processes. In addition, since the OLED may be fabricated at a low temperature and has characteristics of a fast response speed less than 1 ms, low power consumption, a wide viewing angle due to the emissive display, and high contrast, the OLED is attracting public attention as a next generation flat panel display.

Generally, the OLED includes an organic emission layer between an anode and a cathode so that holes supplied from the anode and electrons supplied from the cathode are recombined in the organic emission layer to create an exciton being a hole-electron pair, and the exciton is returned to a ground state to generate energy, thereby emitting light.

FIG. 1 is a cross-sectional view of a conventional OLED.

Referring to FIG. 1, a patterned anode 120 is formed on a substrate 110 having a predetermined element.

An organic pixel defining layer 130 for defining a pixel and made of an insulating material for insulation between organic emission layers is formed on the anode 120. The organic pixel defining layer 130 is made of any one material selected from a group consisting of polyimide (PI), polyamide (PA), acryl resin, benzocyclobutene (BCB), and phenol resin.

The organic pixel defining layer 130 may be deposited on the substrate using a spin coating method. The organic pixel defining layer 130 formed by the spin coating method has a thickness of about 1 μm~2 μm. The organic pixel defining layer 130 is patterned to form an opening, and an organic layer pattern 140 including an organic emission layer is formed on the organic pixel defining layer 130 in addition to the exposed anode.

A cathode 150 is formed on the entire surface of the organic layer pattern 140.

As described above, in the conventional OLED, an organic material as the organic pixel defining layer 130 has been formed by a spin coating method. In this case, since the organic pixel defining layer 130 is formed to a large thickness of about 1 μm~2 μm, a problem may occur that the organic layer pattern formed by the following process is cut due to a large step of the anode and the organic pixel defining layer 130. Dotted lines designate a portion where the organic layer pattern may be cut. In addition, since the organic pixel defining layer 130 is thick, it is difficult to closely adhere the anode to the organic layer on a donor substrate to thereby require a laser beam having high energy during a transfer process. Therefore, there are problems of degrading transfer efficiency, lowering luminous efficiency of the OLED, and reducing lifetime of the OLED.

SUMMARY OF THE INVENTION

The present invention, therefore, solves aforementioned problems associated with conventional devices by providing an organic light emitting display (OLED) and method of fabricating the same capable of improving transfer efficiency, improving luminous efficiency of the OLED, increasing lifetime of the OLED, and preventing an organic layer pattern to be formed from being cut, by forming an inorganic material as a pixel defining layer to a small thickness using a deposition method.

In an exemplary embodiment of the present invention, an organic light emitting display includes: a substrate; a first electrode formed on the substrate; an inorganic pixel defining layer formed on the first electrode and having an opening for exposing at least a portion of the first electrode; an organic layer pattern located on the first electrode and both ends of the inorganic pixel defining layer having the opening, and having at least an emission layer; and a second electrode formed on the organic layer pattern, wherein the inorganic pixel defining layer is formed by a deposition method. As a result, the present invention is capable of improving transfer efficiency, improving luminous efficiency of the OLED, increasing lifetime of the OLED, and preventing an organic layer pattern to be formed from being cut.

In another exemplary embodiment according to the present invention, a method of fabricating an OLED includes: providing a substrate; forming a first electrode on the substrate; forming an inorganic pixel defining layer on the substrate having the first electrode using a deposition method; patterning the inorganic pixel defining layer to form an opening for exposing at least a portion of the first electrode; forming an organic layer pattern having at least an emission layer on the first electrode and both ends of the inorganic pixel defining layer having the opening; and forming a second electrode on the organic layer pattern. The inorganic pixel defining layer may be patterned by a dry or wet etching method.

The inorganic pixel defining layer may be formed by a chemical vapor deposition (CVD) method or a physical vapor deposition (PVD) method. In addition, the PVD method may employ a sputtering method.

The inorganic pixel defining layer may be formed to a thickness of 100~3000 Å, preferably, 100~1000 Å. In addition, the inorganic pixel defining layer may be made of any one material selected from a group consisting of an amorphous silicon layer, a silicon oxide layer, a silicon nitride layer, and a silicon oxynitride layer.

The first electrode may be an anode, and the second electrode may be a cathode, on the contrary, the first electrode may be a cathode, and the second electrode may be an anode.

The organic layer pattern can be formed by LITI method.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
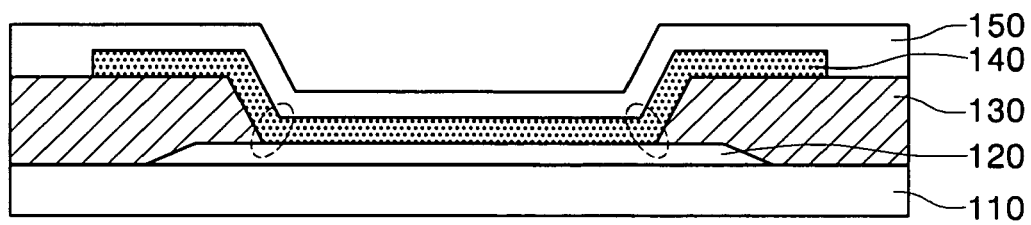
FIG. 1 is a cross-sectional view of a conventional organic light emitting display (OLED)

The present invention will now be described more fully hereinafter with reference to the accompanying drawings, in which preferred embodiments of the invention are shown. This invention may, however, be embodied in different forms and should not be construed as limited to the embodiments set forth herein. Like reference numerals designate like elements throughout the specification.

Figure 2:
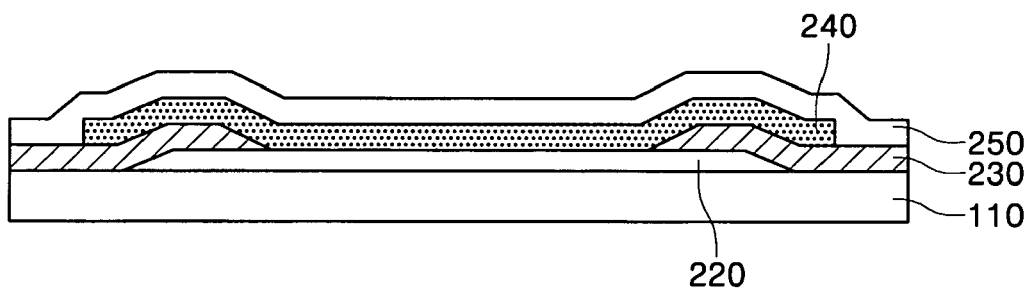
FIG. 2 is a cross-sectional view of an OLED in accordance with the present invention.

FIG. 2 is a cross-sectional view of an OLED in accordance with the present invention.

Referring to FIG. 2, a predetermined element is formed in a substrate 110, and a first electrode 220 is patterned and formed on the substrate 110. The substrate 110 may use a transparent insulating substrate such as glass, plastic or quartz.

When the first electrode is an anode, the first electrode may be a transparent electrode made of ITO or IZO having a high work function, or a reflection electrode having at least two layers including transparent layer and reflection layer on the transparent layer, wherein the reflection layer is made of metal having high reflection characteristics such as aluminum, aluminum alloy or the like. When the first electrode is a cathode, the first electrode may be a thin transparent electrode or a thick reflection electrode made of one material selected from a group consisting of Mg, Ca, Al, Ag and an alloy thereof, which are conductive metal having a is low work function.

An inorganic pixel defining layer 230 is formed on the entire surface of the substrate including the first electrode 220, and includes an opening for exposing at least a portion of the first electrode 220.

The inorganic pixel defining layer 230 may be made of one material selected from a group consisting of inorganic materials such as an amorphous silicon layer, a silicon oxide layer, a silicon nitride layer, a silicon oxynitride layer, and so on.

At this time, the inorganic pixel defining layer 230 is formed by a deposition method, for example, a chemical vapor deposition (CVD) method, a physical vapor deposition (PVD) method or the like. In particular, the PVD method preferably employs a sputtering method. The inorganic pixel defining layer 230 may be formed to a small thickness of 100~3000 Å using the deposition method. In order to effectively perform the following transfer process, preferably, the inorganic pixel defining layer 230 has a thickness of 3000 Å or less. When the inorganic pixel defining layer 230 has a thickness of 3000 Å or more, problems may occur that an organic layer pattern to be formed is cut, or transfer efficiency is lowered. More preferably, the inorganic pixel defining layer 230 is formed to a thin thickness of 100~1000 Å.

An organic layer pattern 240 including at least an emission layer is formed on the first electrode 220 and both ends of the inorganic pixel defining layer having the opening. While the organic layer pattern 240 is transferred onto the first electrode 220 and the inorganic pixel defining layer 230 by irradiating a laser beam, since the inorganic pixel defining layer has a small thickness of 100~1000 Å, the first electrode and the donor substrate having the organic layer are more closely adhered during the transfer process, thereby preventing the organic layer pattern from being cut. In addition, since the transfer may be performed using the laser beam having low energy, transfer efficiency is also improved. Detailed description will be explained in conjunction with FIGS. 3A to 3D.

The organic layer pattern 240 may include at least one layer selected from a hole injection layer, a hole transport layer, a hole blocking layer, an electron transport layer, and an electron injection layer in addition to the emission layer.

A second electrode 250 is formed on the organic layer pattern 240.

When the first electrode 220 is an anode, i.e., a transparent electrode or a reflection electrode having at least two layers including transparent layer and reflection layer on the transparent layer, the second electrode 250 may be formed of a reflection electrode, i.e., a cathode made of one selected from a group consisting of Mg, Ca, Al, Ag and an alloy thereof as conductive metal having a low work function, and when the first electrode 220 is a cathode, the second electrode 250 may be formed of a transparent electrode, i.e., an anode made of ITO or IZO.

FIGS. 3A to 3D are cross-sectional views of sequential processes for explaining a method of fabricating an OLED in accordance with the present invention.

Referring to 3A, a substrate 110 is provided. The substrate 110 may use a transparent insulating substrate such as glass, plastic, and quartz.

Next, a first electrode 320 is formed on the substrate 110. When the first electrode 320 is an anode, the first electrode 320 may be a reflection electrode having at least two layers including transparent layer and reflection layer on the transparent layer, wherein the reflection layer is made of metal having high reflection characteristics. When the first electrode 320 is a cathode, the first electrode 320 may be formed of a thin transparent electrode or a thick reflection electrode made of one material selected from a group consisting of Mg, Ca, Al, Ag and an alloy thereof as conductive material having a low work function.

The first electrode 320 may be deposited by a sputtering method or an ion plating method. More preferably, the first electrode 320 may be deposited by the sputtering method, and then may be formed by selectively patterning using a photoresist (PR) as a mask through a wet etching method, wherein the photoresist (PR) is patterned in a photolithography process.

Next, an inorganic pixel defining layer 330 is formed on the substrate including the first electrode 320. The inorganic pixel defining layer 330 functions to define a unit pixel region.

While the conventional art uses an organic material as a pixel defining layer, the present invention uses an inorganic material to form the inorganic pixel defining layer 330. The inorganic material for forming the inorganic pixel defining layer 330 may use one selected from an amorphous silicon layer, a silicon oxide layer, a silicon nitride layer, and a silicon oxynitride layer.

The inorganic pixel defining layer 330 is formed by a deposition method. The deposition method for forming a thin layer generally uses a CVD or PVD method.

The CVD method is a method of obtaining a thin layer made of a desired material through chemical reaction, which may be used to from the inorganic pixel defining layer. In the conventional CVD process, ambient temperature reaction gas is introduced into a reaction chamber. The reaction gas is heated until it arrives to a deposition surface, and heat is continuously supplied to the reaction gas by convection or heating of the deposition surface. According to various process conditions, the reaction gas may generate regular reaction in vapor before it arrives to the deposition surface. Since a gas flow is heated, speed is lowered due to viscosity. In addition, by a change of the gas composition, interface layers of heat, momentum, and chemical composition are formed. The introduced gas or reaction intermediate (generated due to vapor thermal decomposition) generates irregular reaction at the deposition surface, thereby forming a thin layer. Next, vapor byproducts are discharged from the reaction chamber. The inorganic pixel defining layer 330 may be formed using the CVD method. The CVD method may be classified into various methods, i.e., atmospheric pressure CVD (APCVD) and low pressure CVD (LPCVD) depending on pressure in the reaction chamber, and the APCVD may be classified into low temperature CVD (LTCVD) and high temperature CVD (HTCVD) depending on performed temperature regions. And otherwise, plasma CVD (PECVD), photo CVD (PHCVD) and so on may be used.

The PVD method is a method of applying energy to a substrate or a gob made of thin material to physically separate a corresponding material having kinetic energy so that the separated material is deposited on another substrate to form a thin layer, which may be classified into sputtering and vacuum deposition.

The sputtering method is a method of colliding high-energy particles to a substrate made of the same material as a desired thin layer to separate an atom and a molecule, thereby forming a thin layer. The vacuum deposition method is a method of heating a material, which is to be deposited, in a vacuum vessel to increase vapor pressure to thereby deposit the material on a substrate. The inorganic pixel defining layer 330 may be formed by the PVD method.

As described above, the present invention is characterized in that the inorganic pixel defining layer 330 is formed by the deposition method. The inorganic pixel defining layer 330 formed by the deposition method may be formed to a thickness of 100~3000 Å. In addition, preferably, the inorganic pixel defining layer 330 is formed to a small thickness of 100~1000 Å, and may be formed to a thickness of 100 Å.

Figure 3A:
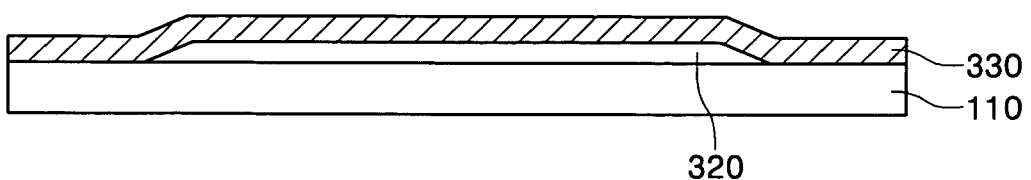
FIGS. 3A to 3D are cross-sectional views of sequential processes for explaining a method of fabricating an OLED in accordance with the present invention.
Figure 3B:
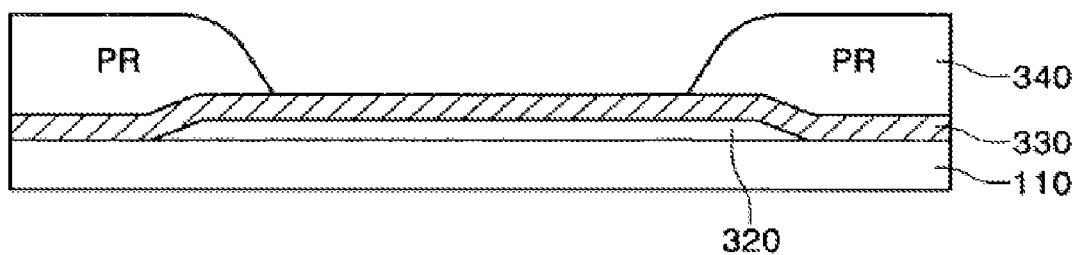
Figure 3C:
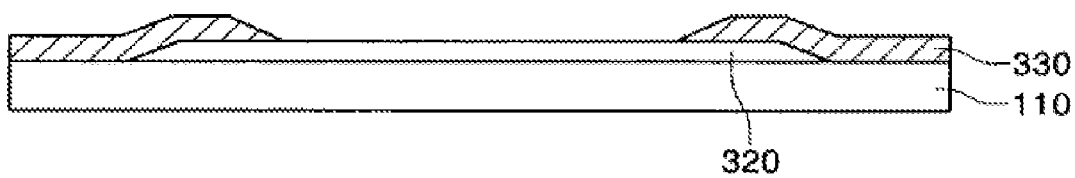

Referring to FIGS. 3B and 3C, the inorganic pixel defining layer 330 is patterned to form an opening for exposing at least a portion of the first electrode 320. The inorganic pixel defining layer 330 may be patterned by a dry or wet etching method.

The dry etching method is a method of etching using a physical method by ion impact, or a method applied a chemical action of reaction materials generated in plasma, or a method simultaneously applied a chemical and a physical phenomenon as a chemical action made by ions, electrons and photons.

The inorganic pixel defining layer 330 is selectively removed by an etching process using a photoresist pattern 340 formed in a photolithography process to be transferred and formed on the substrate in a pattern designed in a reticle. Preferably, the dry etching method is performed by a plasma etching method of plasma discharging the reaction gas in a certain pressure of chamber to decompose into ions, radicals, and electrons, and of causing the radicals generated at this time to generate chemical reaction and the resulting etching action.

The wet etching method is a method of removing the inorganic pixel defining layer 330 corresponding to the photoresist pattern 340 using a chemical solution, which may use a dipping method, a spray method, and a composite method.

Figure 3D:
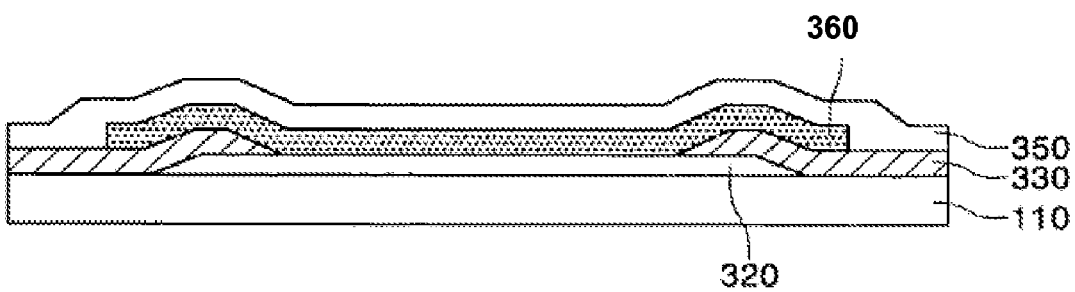

Referring to FIG. 3D, an organic layer pattern 360 including at least an emission layer is formed on the first electrode 320 and both ends of the inorganic pixel defining layer 330 having an opening. The organic layer pattern 360 may be formed using various methods such as inkjet printing, LITI (laser induced thermal imaging), spin coating, deposition, and so on. Preferably, the organic layer patter 360 is formed using the LITI method. A donor substrate (not shown) having an organic layer is laminated on the entire surface of the substrate, and then the laser beam is irradiated on a predetermined region of the donor substrate to form the organic layer patter 360 on the first electrode 320 and both ends of the inorganic pixel defining layer 330 having the opening.

At this time, as described above, since the inorganic pixel defining layer 330 is formed to have a small thickness of 100~3000 Å, preferably, 100~1000 Å, and a step between the first electrode 320 and the inorganic pixel defining layer 330 is formed at a small height to improve transfer efficiency during the process of forming the organic layer pattern 360. That is, since the transfer may be performed using the laser beam having low energy, luminous efficiency and lifetime of the OLED may be increased. In addition, it is possible to prevent the organic layer pattern to be formed from being cut.

The organic layer pattern 360 includes at least an emission layer, and may further include at least one layer selected from a hole injection layer, a hole transport layer, a hole blocking layer, an electron transport layer, and an electron injection layer in addition to the emission layer.

A second electrode 350 is continuously formed on the entire surface of the organic layer pattern 340. The second electrode 320 is a transparent electrode, such as an anode or a reflection electrode, having at least two layers including transparent layer and a reflection layer on the transparent layer, or the second electrode is a reflection electrode, i.e. a cathode formed on one material selected from a group consisting of Mg, Ca, Al, Ag, and an alloy thereof as conductive metal having a low work function. When the first electrode 320 is a cathode, the second electrode 350 is a transparent electrode, i.e., an anode formed of ITO or IZO.

As can be seen from the foregoing, an OLED and method of fabricating the same in accordance with the present invention is capable of improving transfer efficiency, improving luminous efficiency of the OLED, and increasing lifetime of the OLED, by forming an inorganic material as a pixel defining layer to a small thickness using a deposition method to closely adhere the first electrode to the organic layer on the donor substrate during the transfer process to thereby enable the transfer process using a laser beam having low energy. In addition, there is an advantage of preventing the organic layer pattern from being cut due to the step between the first electrode and the inorganic pixel defining layer.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display, comprising:
a substrate;
a first electrode formed on the substrate;
an inorganic pixel defining layer formed on the first electrode and having an opening for exposing at least a portion on the first electrode;
an organic layer pattern located on the first electrode and both ends of the inorganic pixel defining layer having the opening, and having at least an emission layer; and
a second electrode formed on the organic layer pattern,
wherein the organic layer pattern comprises two peaks, the peaks being located where a distance between the organic layer pattern and the substrate is greatest, and the organic layer pattern extends toward the substrate on each side of each peak,
wherein the inorganic pixel defining layer is formed by a deposition method, wherein the second electrode contacts the inorganic pixel defining layer, and wherein a maximum thickness of a portion of the inorganic pixel defining layer disposed between and contacting the first electrode and the organic layer pattern is equal to a maximum thickness of a remaining portion of the inorganic pixel defining layer.

2. The organic light emitting display according to claim 1, wherein the inorganic pixel defining layer is formed by any one of a chemical vapor deposition (CVD) method and a physical vapor deposition (PVD) method.

3. The organic light emitting display according to claim 2, wherein the inorganic pixel defining layer is formed by a sputtering method.

4. The organic light emitting display according to claim 1, wherein the inorganic pixel defining layer is made of one material selected from a group consisting of an amorphous silicon layer, a silicon oxide layer, a silicon nitride layer, and a silicon oxynitride layer.

5. The organic light emitting display according to claim 1, wherein the maximum thickness of the inorganic pixel defining layer is 100 Å to less than 1000 Å.

6. The organic light emitting display according to claim 5, wherein the inorganic pixel defining layer comprises an amorphous silicon layer or a silicon nitride layer.

* * * * *